United States Patent [19]

Christiaan

[11] Patent Number: 4,789,795
[45] Date of Patent: Dec. 6, 1988

[54] LOGIC VOTING-CIRCUIT

[75] Inventor: Steinz H. Christiaan, Hattem, Netherlands

[73] Assignee: HCS Industrial Safeguarding B.V., Hattem, Netherlands

[21] Appl. No.: 109,537

[22] Filed: Oct. 19, 1987

[30] Foreign Application Priority Data

Oct. 21, 1986 [NL] Netherlands .................. 8602636

[51] Int. Cl.4 .................................... H03K 19/08
[52] U.S. Cl. .................................... 307/401; 307/408; 307/410; 307/413; 307/464
[58] Field of Search .................. 307/401–415, 307/441, 455, 464, 462, 476, 306; 235/51, 50 R, 54 F, 54 R, 55 R; 340/825.69; 364/409, 507, 416, 454, 555; 365/4, 5, 10, 16, 23, 43, 33, 41, 42

[56] References Cited

U.S. PATENT DOCUMENTS

| | | | |
|---|---|---|---|
| 2,742,632 | 4/1956 | Whitely | 307/415 X |
| 2,776,380 | 1/1957 | Andrews | 307/407 |
| 2,904,780 | 9/1959 | Meyerhoff | 307/411 X |
| 2,919,354 | 12/1959 | Russell | 307/411 |
| 2,932,815 | 4/1960 | Cabaniss et al. | 307/407 X |
| 2,959,767 | 11/1960 | Wasser | 307/413 X |
| 3,041,466 | 6/1962 | Cray et al. | 307/413 |
| 3,097,306 | 7/1963 | Mintzer | 307/409 |
| 3,121,172 | 2/1964 | Mintzer | 307/411 |
| 3,123,718 | 3/1964 | Knox-Seith | 307/408 |
| 3,145,307 | 8/1964 | Zuccaro | 307/410 |
| 3,271,581 | 9/1966 | Yochelson | 307/410 |
| 3,390,277 | 6/1968 | Spandorfer | 307/410 |
| 3,502,898 | 3/1970 | Paivinen | 307/411 |
| 3,832,566 | 8/1974 | Gerry | 307/410 |
| 4,375,683 | 3/1983 | Wensley | 307/464 X |

FOREIGN PATENT DOCUMENTS 838809 6/1960 United Kingdom .

OTHER PUBLICATIONS

Elektronik, vol. 26, No. 12, Oct. 1977, by K. Meyer.

Primary Examiner—William M. Shoop, Jr.
Assistant Examiner—Paul Ip
Attorney, Agent, or Firm—John P. Snyder

[57] ABSTRACT

A majority logic voting system employs at least three magnetic AND gates, each having first and second inputs and an output. The first input to each gate is connected as the second input to another gate and the outputs are connected in common so that the gates are in parallel. A diode is connected between the first and second inputs of each gate. Further, an additional circuit may be connected to determine the current difference between the output of each gate and the second input to another gate.

4 Claims, 1 Drawing Sheet

LOGIC VOTING-CIRCUIT

The invention relates to a logic circuit having a plurality (N) inputs, the amount of which is at least three (N≧3), said inputs being adapted to be supplied with binary input signals, and having an output supplying a binary output signal, the value of which equals the majority of the values of the input signals.

Such a circuit is known. It is e.g. described in applicants3 hand-book concerning logic safe-guarding systems and logic circuits of the magnetic type "Maglog-14 system specification".

The mentioned prior art system has, particularly in case of fail-safe circuits, of which an extreme reliability is required, the disadvantage that the voting-mechanism is present only in a single fashion, and therefore is a potentially vulnerable part in a total safe-guarding-chain. Furthermore it is desired to engineer a voting-circuit of the type meant here in such a way that the logic blocks forming part of the circuit are galvanically fully separated, in such a way that interactions between those blocks, due to which errors, if any, could cross-talk, cannot occur.

For completeness' sake now the truth-table of a voting-circuit of the 2 from 3 type will follow.

| TRUTH-TABLE | | | | |
|---|---|---|---|---|
| x | y | z | p | |
| 0 | 0 | 0 | 0 | CORRECT |
| 0 | 0 | 1 | 0 | |
| 0 | 1 | 0 | 0 | |
| 0 | 1 | 1 | 1 | ERROR-SITUATIONS |
| 1 | 0 | 0 | 0 | |
| 1 | 0 | 1 | 1 | |
| 1 | 1 | 0 | 1 | |
| 1 | 1 | 1 | 1 | CORRECT |

The x, y and z represent the binary values of the three input signals; the p represents the binary value of the output signal. Only the upper and lower row of binary numbers give a "correct" situation; the six rows in between all relate to a "faulty" situation, in which the voting-circuit takes a decision on basis of the majority-value.

It should be noted that this is only an example. Also other number of inputs are possible.

Also in view of the above considerations the invention now proposes to provide a logic circuit of the type mentioned in the preamble with a number (N) and AND-gates, the number (N) corresponding to the number (N) of inputs, of the magnetic type, each having a magnetizable element, e.g. a ring core, a first input connected with a writing winding cooperating with said element, a second input connected with a reading winding cooperating with said element, and an output connected with a detection-winding cooperating with said element, said inputs of the AND-gates being connected with a corresponding input of the circuit, in which the first input of an AND-gate (1, 2 . . . , N-1, 1) is connected with the second input of the next AND-gate (2, 3 . . . , N, 1), and the outputs of all AND-gates being connected with the output of the circuit. In a preferred embodiment the circuit according to the invention has the specific feature that between the second input and the first input of every AND-gate a diode is conductively connected. Such a configuration has the advantage of an adhanced "availability" of the circuit. Namely, the circuit keeps functioning if one of the AND-gates is removed, e.g. for maintenance or repair, or is defective. It will be clear that in case of a removed AND-gate the input information of that AND-gate does no longer form part of the operation of the total circuit.

In a further embodiment the circuit according to the invention has the specific feature that every AND-gate has a circuit added to it for determining the difference between the currents through the connection between the output of an AND-gate and the output of the circuit, and the connection between the first input of the related AND-gate (1, 2, . . . , N-1, N) and the second input of the next-following AND-gate (2, 3, . . . , N, 1) and the supply of a difference-signal in case of a sensed difference. As an explanation it is hereby noted that the mutual equality of the AND-function and the signal itself gives an indication in relation to an error, if any. The difference signal, therefore, can be used for controlling a warning circuit in such a way that an operator can, e.g. by means of a permanently lit LED, trace the error immediately and can change the related unit.

The circuit according to the invention is in principle comprisable and expandable at will.

The invention will now be explained with reference to some arbitrary embodiments, to which the invention is not limited. In the drawings.

Figure 1:
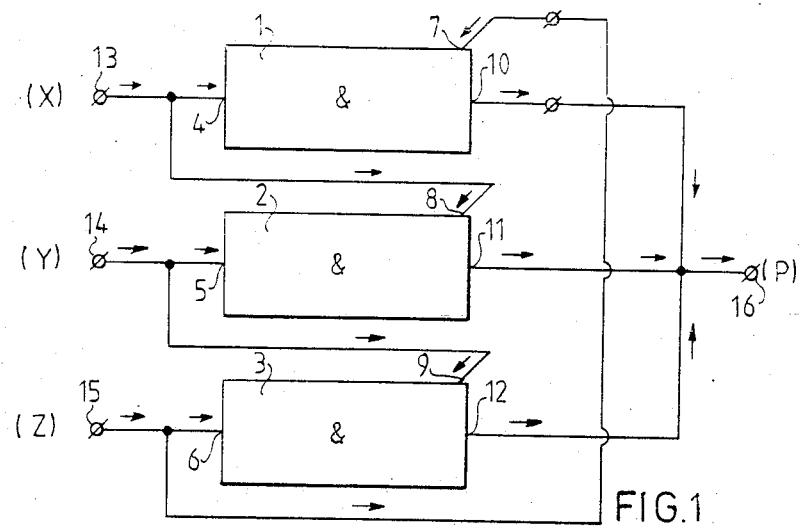
FIG. 1 is a block-schematic diagram of a 2 from 3 voting-circuit in embodiment.

FIG. 1 shows three AND-gates 1, 2, 3, each of the magnetic type. They are each provided with a first input, 4, 5, 6, respectively, and a second input 7, 8, 9, respectively, and an output 10, 11, 12, respectively.

As AND-gates of the magnetic type are known per se, they will not be discussed here further. It is sufficient to note that the inputs are adapted for conducting control-currents and on basis thereof change the magnetisation-condition of a magnetic element, whilst the outputs are connected with detection-conductors, positioned in such a way relative to a magnetisable element that they supply an electrical signal in case of a change of the magnetisation-condition of the magnetizable element. Each input and each output, therefore, has two terminals. The diagram according to FIG. 1, therefore, has to be considered as schematical and symbolic. The total voting-circuit shown in FIG. 1 comprises three inputs, 13, 14, 15, respectively, to which the input-signals according to the above table are supplied. These three inputs 13, 14, 15, respectively, are connected with the first respective inputs 4, 5 and 6 of the corresponding AND-gates 1, 2, 3. The first input 4 of the AND-gate 1 is connected with the second input 8 of the AND-gate 2. The first input 5 of the AND-gate 2 is connected with the second input 9 of the AND-gate 3. The first input 6 of the AND-gate 3 is connected with the second input 7 of the AND-gate 1. Therefore, this can be considered to be a cyclic circuit. The outputs 10, 11, 12 are all connected with the output 16 of the circuit, at which the output signal p according to the mentioned table is available.

In FIG. 1 the directions of signal transfer are indicated with arrows. For the sake of clarity of the diagram these arrows do not bear reference numbers.

Figure 2:
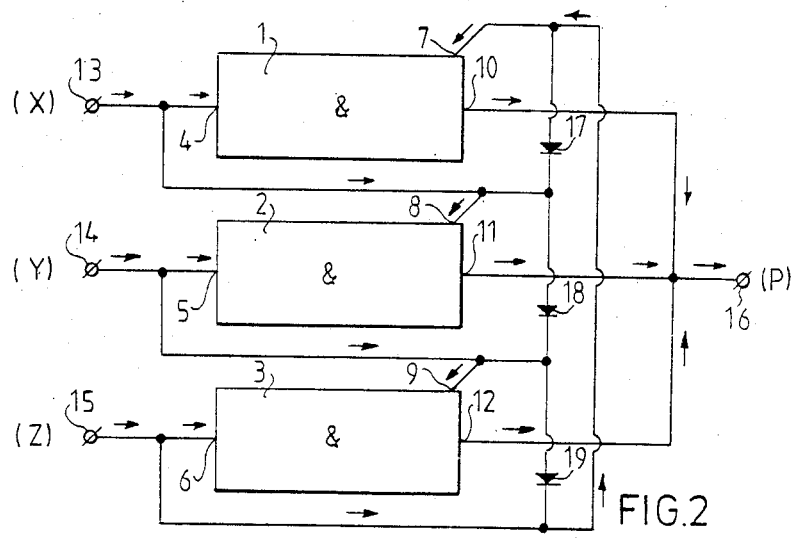
FIG. 2 is a larger version of the circuit according to FIG. 1.

In FIG. 2 corresponding parts are indicated with the same reference numbers as in FIG. 1. These parts will not be discussed again.

The difference between the circuit according to FIG. 2 and the circuit according to FIG. 1 is residing in the presence in the circuit according to FIG. 2 of diodes 17, 18, 19. These diodes are connected between the second input 7, 8, 9, respectively, and the first input 4, 5, 6, respectively, of the related AND-gate 1, 2, 3.

Figure 3:
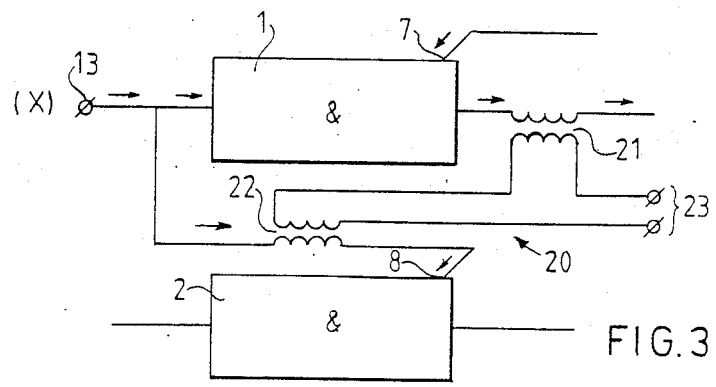
FIG. 3 is an example of a part of a circuit according to the invention, namely and AND-gate having a difference-circuit added to it.

FIG. 3, at last, shows the AND-gate 1, having added to it a circuit 20 for assessing the difference between the current through the output 10 of the AND-gate 1 and the connection between the first input 4 of the AND-gate 1 and the second output 8 of the AND-gate 2. This circuit 20 is designed in the form of two transformers 21, 22, the primary windings of which form part of the mentioned connections, and the secondary windings of which are connected in phase in such a way, that at the output 23 of the difference-circuit 20 a difference-signal is present in case of a difference between the currents through the two primary windings.

I claim:

1. A logic majority voting circuit comprising the combination of a plurality n, n+1, ..., N of at least three magnetic AND gates, each comprising a magnetizable core having a writing winding, a reading winding and a detection winding;

a plurality n, n+1, ..., N of inputs for the logic circuit, each connected to a different one of the writing windings;

an output for the logic circuit connected in common with all of the detection windings so that the AND gates are in parallel; and the reading winding of each AND gate being connected to the writing winding of a different AND gate so that each AND gate has two inputs, one of which is one of the n, n+1, ..., N inputs and the other of which is a different one of such inputs.

2. A logic majority voting circuit as defined in claim 1 including a diode connected between the two inputs of each AND gate.

3. A logic majority voting circuit as defined in claim 2 including additional circuit means for determining the difference between the current in the output of each AND gate and in the reading winding of that other AND gate which is connected to the writing winding of such each and gate.

4. A logic majority voting circuit as defined in claim 1 including additional circuit means for determining the difference between the current in the output of each AND gate and in the reading winding of that other AND gate which is connected to the writing winding of such each AND gate.

* * * * *

UNITED STATES PATENT AND TRADEMARK OFFICE
CERTIFICATE OF CORRECTION

PATENT NO. : 4,789,795
DATED : December 6, 1988
INVENTOR(S) : Hendrik Christiaan Steinz It is certified that error appears in the above-identified patent and that said Letters Patent is hereby corrected as shown below:

On the title page inventor should read

--(75) Inventor: Hendrik C. Steinz --

Item (19) under United States Patent, "Christiaan" should read -- Steinz --.

Signed and Sealed this

First Day of August, 1989

Attest:

DONALD J. QUIGG

Attesting Officer

Commissioner of Patents and Trademarks